United States Patent
Sharma et al.

(10) Patent No.: US 12,460,294 B2
(45) Date of Patent: Nov. 4, 2025

(54) HEATER DESIGN SOLUTIONS FOR CHEMICAL DELIVERY SYSTEMS

(71) Applicant: Lam Research Corporation, Fremont, CA (US)

(72) Inventors: Davinder Sharma, San Jose, CA (US); Christopher J. Rau, Milpitas, CA (US); Panya Wongsenakhum, Fremont, CA (US); Charlie Damaso, San Jose, CA (US); Marvin Clayton Brees, Boulder Creek, CA (US)

(73) Assignee: Lam Research Corporation, Fremont, CA (US)

( * ) Notice: Subject to any disclaimer, the term of this patent is extended or adjusted under 35 U.S.C. 154(b) by 572 days.

(21) Appl. No.: 17/922,279

(22) PCT Filed: Apr. 27, 2021

(86) PCT No.: PCT/US2021/029452
§ 371 (c)(1),
(2) Date: Oct. 28, 2022

(87) PCT Pub. No.: WO2021/222292
PCT Pub. Date: Nov. 4, 2021

(65) Prior Publication Data
US 2023/0175128 A1    Jun. 8, 2023

Related U.S. Application Data

(60) Provisional application No. 63/018,288, filed on Apr. 30, 2020.

(51) Int. Cl.
C23C 16/448 (2006.01)
C23C 16/455 (2006.01)
(Continued)

(52) U.S. Cl.
CPC .... C23C 16/4485 (2013.01); C23C 16/45561 (2013.01); C23C 16/45565 (2013.01); C23C 16/5096 (2013.01); H01L 21/67017 (2013.01)

(58) Field of Classification Search
CPC .......... C23C 16/4485; C23C 16/45561; C23C 16/45565; C23C 16/5096; H01L 21/67017
See application file for complete search history.

(56) References Cited

U.S. PATENT DOCUMENTS 3,651,240 A * 3/1972 Kirkpatrick ............. F27D 11/06
 392/394
3,677,329 A * 7/1972 Kirkpatrick ............. H05B 3/64
 29/890.032
(Continued)

FOREIGN PATENT DOCUMENTS

CN    115485412    12/2022
JP    H02210822    8/1990
(Continued)

OTHER PUBLICATIONS

International Application Serial No. PCT/US2021/029452, International Search Report mailed Aug. 20, 2021, 3 pgs.
(Continued)

*Primary Examiner* — Jeffrie R Lund
(74) *Attorney, Agent, or Firm* — Schwegman Lundberg & Woessner, P.A.

(57) ABSTRACT

A semiconductor substrate processing apparatus includes a chemical isolation chamber for processing a semiconductor substrate, a chemical delivery module, and a control module. The chemical delivery module is in fluid communication with the chamber and includes a canister oven, a control oven, and a heating element. The canister oven generates a process gas using a heated precursor. The control oven receives the process gas via a first gas line and supplies the
(Continued)

process gas to the chamber via a second gas line. The first gas line extends between an inside surface of the canister oven and an inside surface of the control oven. The heating element heats a portion of the first gas line between the inside surface of the canister oven and the inside surface of the control oven. The controller module adjusts a heating temperature of the heating element based on a temperature of the portion.

20 Claims, 7 Drawing Sheets

(51) Int. Cl.
    *C23C 16/509*     (2006.01)
    *H01L 21/67*     (2006.01)

(56) References Cited

U.S. PATENT DOCUMENTS

| | | | |
|---|---|---|---|
| 8,343,281 B2 | 1/2013 | Hong et al. | |
| 11,183,400 B2 * | 11/2021 | Chandrasekharan | H01L 21/67098 |
| 2019/0177840 A1 * | 6/2019 | Eldridge | C23C 16/4487 |
| 2019/0264324 A1 | 8/2019 | Shugrue et al. | |
| 2020/0051834 A1 | 2/2020 | Chandrasekharan et al. | |
| 2023/0175128 A1 * | 6/2023 | Sharma | C23C 16/45565 |
| | | | 118/715 |

FOREIGN PATENT DOCUMENTS

| | | | |
|---|---|---|---|
| JP | H0897160 | 4/1996 | |
| JP | H10500733 | 1/1998 | |
| JP | 2009084625 | 4/2009 | |
| JP | 2016191140 | 11/2016 | |
| JP | 2023523945 | 6/2023 | |
| KR | 20080070893 A | 8/2008 | |
| TW | I518198 | 1/2016 | |
| WO | WO-9703540 A2 * | 1/1997 | F16L 53/35 |
| WO | 0036640 | 6/2000 | |
| WO | WO-2004011694 A2 | 2/2004 | |
| WO | WO-2020171467 A1 * | 8/2020 | C23C 16/45561 |
| WO | WO-2021222292 A1 * | 11/2021 | C23C 16/45565 |

OTHER PUBLICATIONS

International Application Serial No. PCT/US2021/029452, Written Opinion mailed Aug. 20, 2021, 7 pgs.
"Korean Application Serial No. 10-2022-7041952, Voluntary Amendment filed Apr. 23, 2024", w English claims, 5 pgs.
"Japanese Application Serial No. 2022-564501, Voluntary Amendment filed Apr. 24, 2024", w English claims, 17 pgs.
"Japanese Application Serial No. 2022-564501, Notification of Reasons for Refusal mailed Dec. 10, 2024", w English Translation, 12 pgs.
"Taiwanese Application Serial No. 110115707, Office Action mailed Jan. 17, 2025", w English translation, 13 pgs.
"Japanese Application Serial No. 2022-564501, Response filed Mar. 3, 2025 to Notification of Reasons for Refusal mailed Dec. 10, 2024", w current English claims, 13 pgs.
"Taiwanese Application Serial No. 110115707, Response filed Mar. 20, 2025 to Office Action mailed Jan. 17, 2025", w English claims, 31 pgs.
"International Application Serial No. PCT US2021 029452, International Preliminary Report on Patentability mailed Nov. 10, 2022", 9 pgs.

\* cited by examiner

HEATER DESIGN SOLUTIONS FOR CHEMICAL DELIVERY SYSTEMS

CLAIM OF PRIORITY

This application is a U.S. National Stage Filing under 35 U.S.C. 371 from International Application No. PCT/US2021/029452, filed on Apr. 27, 2021, and published as WO 2021/222292 A1 on Nov. 4, 2021, which claims the benefit of priority to U.S. Provisional Patent Application Ser. No. 63/018,288, filed on Apr. 30, 2020, each of which is incorporated by reference herein in its entirety.

TECHNICAL FIELD

The subject matter disclosed herein generally relates to systems, methods, apparatuses, and machine-readable media associated with heater design solutions for chemical delivery systems for a substrate processing apparatus.

BACKGROUND

Semiconductor substrate processing apparatuses are used to process semiconductor substrates by techniques including etching, physical vapor deposition (PVD), chemical vapor deposition (CVD), plasma-enhanced chemical vapor deposition (PECVD), atomic layer deposition (ALD), plasma-enhanced atomic layer deposition (PEALD), pulsed deposition layer (PDL), plasma-enhanced pulsed deposition layer (PEPDL) processing, and resist removal. One type of a substrate processing apparatus includes a reaction chamber containing top and bottom electrodes where radio frequency (RF) power is applied between the electrodes to excite a process gas into a plasma for processing semiconductor substrates in the reaction chamber.

Another type of a substrate processing apparatus includes an ALD tool, which is a specialized type of CVD processing system in which ALD reactions occur between two or more chemical species introduced as process gasses within a chemical isolation chamber (e.g., an ALD processing chamber). The process gasses (e.g., precursor gases) are used to form a thin film deposition of a material on a substrate, such as a silicon wafer as used in the semiconductor industry. The precursor gases are sequentially introduced into the ALD processing chamber from a gas source so that the gases react with a surface of the substrate to form a deposition layer upon combining.

Multiple gas lines can be used to supply the process gasses from a gas source to the chemical isolation chamber. The gas lines, however, may pass through non-uniform environments (e.g., insulated walls) which creates cold spots in the gas lines. Such cold spots result in clogging the gas lines and reducing the flow of process gases into the chemical isolation chamber.

The background description provided herein is to generally present the context of the disclosure. It should be noted that the information described in this section is presented to provide the skilled artisan some context for the following disclosed subject matter and should not be considered as admitted prior art. More specifically, work of the presently named inventors, to the extent it is described in this background section, as well as aspects of the description that may not otherwise qualify as prior art at the time of filing, are neither expressly nor impliedly admitted as prior art against the present disclosure.

SUMMARY

Methods, systems, and computer programs are presented for semiconductor substrate processing, including techniques for heater design solutions for chemical delivery systems for a chemical isolation chamber used for processing the semiconductor substrate.

In an example embodiment, a semiconductor substrate processing apparatus includes a chemical isolation chamber for processing a semiconductor substrate. The semiconductor substrate processing apparatus further includes a chemical delivery module in fluid communication with the chemical isolation chamber. The chemical delivery module includes a canister oven, a control oven, and a heating element. The canister oven is configured to heat a precursor to a predetermined temperature and generate a process gas using the heated precursor. The control oven is configured to receive the process gas via a first gas line and supply the process gas to the chemical isolation chamber via a second gas line for processing the semiconductor substrate. The first gas line extends between an inside surface of the canister oven and an inside surface of the control oven. The heating element is configured to heat a portion of the first gas line between the inside surface of the canister oven and the inside surface of the control oven. The semiconductor substrate processing apparatus further includes a controller module coupled to the chemical delivery module and the chemical isolation chamber. The controller module is configured to detect the temperature of the portion of the first gas line and adjust the heating temperature of the heating element based on the detected temperature.

In another example embodiment, a chemical delivery module for supplying process gas to a chemical isolation chamber of a semiconductor substrate processing apparatus includes a canister oven, a control oven, a heating element, and a controller module. The canister oven is configured to heat a precursor to a predetermined temperature and generate the process gas using the heated precursor. The control oven is configured to receive the process gas via a first gas line and supply the process gas to the chemical isolation chamber via a second gas line for processing the semiconductor substrate. The first gas line extends between an inside surface of the canister oven and an inside surface of the control oven. The heating element is configured to heat a portion of the first gas line between the inside surface of the canister oven and the inside surface of the control oven. The controller module is configured to detect the temperature of the portion of the first gas line and adjust the heating temperature of the heating element based on the detected temperature.

In yet another example embodiment, a method for processing a semiconductor substrate includes heating a precursor within a canister oven to a predetermined temperature to generate a process gas. The method further includes supplying the process gas via a gas line to a chemical isolation chamber in which the semiconductor substrate is processed. The gas line extends between the canister oven and the chemical isolation chamber. The method further includes heating a portion of the gas line extending between the inside surface of the canister oven and the inside surface of the control oven using a heating element. The method further includes monitoring the surface temperature of the heating element. The method further includes adjusting the heating temperature of the heating element based on the surface temperature.

BRIEF DESCRIPTION OF THE DRAWINGS

Various ones of the appended drawings merely illustrate example embodiments of the present disclosure and cannot be considered as limiting its scope.

DETAILED DESCRIPTION

Figure 1:
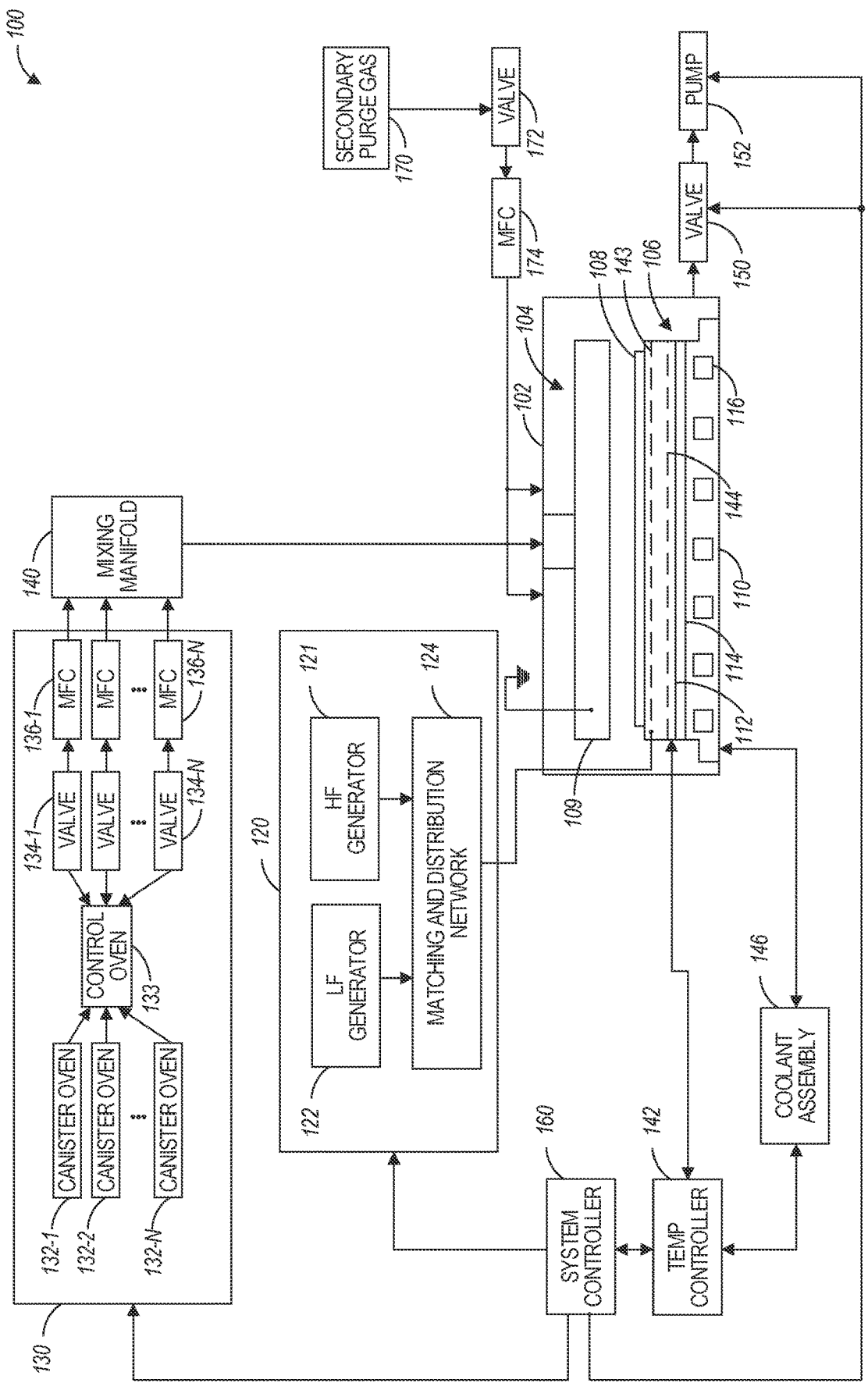
FIG. 1 is a functional block diagram of an example of a substrate processing system in which examples of the present disclosure may be used.

The description that follows includes systems, methods, techniques, instruction sequences, and computing machine program products (e.g., stored on machine-readable media) that embody illustrative embodiments of the present disclosure. In the following description, for purposes of explanation, numerous specific details are outlined to provide a thorough understanding of example embodiments directed to additive manufacturing (such as direct metal laser sintering) using sonic excitation (e.g., ultrasonic and megasonic vibration) to reduce hot tearing. It will be evident, however, to one skilled in the art, that the present embodiments may be practiced without these specific details.

A portion of the disclosure of this patent document contains material that is subject to copyright protection. The copyright owner has no objection to the facsimile reproduction by anyone of the patent document or the patent disclosure, as it appears in the Patent and Trademark Office patent files or records, but otherwise reserves all copyright rights whatsoever. The following notice applies to any data as described below and in the drawings that form a part of this document: Copyright Lam Research Corporation, 2020, All Rights Reserved.

FIG. 1 is a functional block diagram of an example of a substrate processing system 100 in which examples of the present disclosure may be used. Referring now to FIG. 1, the example substrate processing system 100 is configured for performing deposition as shown. While a PECVD substrate processing system is shown as the system 100, a PEALD substrate processing system or other substrate processing system may be used. The substrate processing system 100 includes a chemical isolation chamber (also referred to as a processing chamber or a substrate processing chamber) 102 that encloses other components of the substrate processing system 100 and contains plasma. The substrate processing chamber 102 includes a gas distribution device 104 and substrate support 106, such as an electrostatic chuck (ESC). During operation, a substrate 108 is arranged on the substrate support 106.

In some examples, the gas distribution device 104 may include a powered showerhead 109 that distributes process gases over the substrate 108 and induces ion bombardment.

The showerhead 109 may include a stem portion including one end connected to a top surface of the processing chamber 102. A base portion is generally cylindrical and extends radially outwardly from an opposite end of the stem portion at a location that is spaced from the top surface of the processing chamber 102. A substrate-facing surface or faceplate of the base portion of the showerhead 109 includes a plurality of distributed holes through which process gas (or gases) flows. The gas distribution device 104 may be made of a metallic material and may act as an upper electrode. Alternately, the gas distribution device 104 may be made of a non-metallic material and may include an embedded electrode. In other examples, the upper electrode may include a conducting plate and the process gases may be introduced in another manner.

The substrate support 106 includes a conductive baseplate 110 that acts as a lower electrode. The baseplate 110 supports a heating plate 112, which may correspond to a ceramic multi-zone heating plate. A thermal resistance layer 114 may be arranged between the heating plate 112 and the baseplate 110. The baseplate 110 may include one or more coolant channels 116 for flowing coolant through the baseplate 110.

A Radio Frequency (RF) generating system 120 generates and outputs an RF voltage to one of the upper electrodes (e.g., the gas distribution device 104) and the lower electrode (e.g., the baseplate 110 of the substrate support 106). The other one of the upper electrode and the lower electrode may be DC grounded at 143, AC grounded, or floating. In some examples, the RF generating system 120 may supply dual-frequency power including a high frequency (HF) generator 121 and a low frequency (LF) generator 122 that generate the HF and LF power (at predetermined frequencies and power levels, respectively) that is fed by a matching and distribution network 124 to the upper electrode or the lower electrode (or the showerhead).

A chemical delivery system (also referred to as a chemical delivery module) 130 includes process gas sources such as one or more canister ovens 132-1, 132-2, . . . , and 132-N (collectively, process gas sources or canister ovens 132), where N is an integer greater than zero. The process gas sources are fluidly coupled (e.g., via a plurality of gas lines) to a control oven 133, which is configured to control the temperature of the process gasses supplied by the canister ovens 132 as well as distribution of the process gasses to corresponding valves 134-1, 134-2, . . . , and 134-N.

The process gas sources 132 supply one or more process gas mixtures, dopants, carrier gas, liquid precursors, and/or purge gas. In some examples, the chemical delivery system 130 delivers a precursor gas, such as a mixture of tetraethyl orthosilicate (TEOS) gas, a gas including an oxygen species and argon (Ar) gas during deposition, and dopants including triethyl phosphate (TEPO) and/or triethyl borate (TEB). In some examples, diffusion of the dopants occurs from the gas phase. For example, a carrier gas (e.g., nitrogen, argon, or other) is enriched with the desired dopant (also in gaseous form, e.g., triethyl phosphate (TEPO) and/or triethyl borate (TEB)) and supplied to the silicon wafer on which a concentration balance can take place. In subsequent processes, a wafer may be placed in a quartz tube that is heated to a certain temperature.

Retuning to FIG. 1, the process gas sources 132 and the control oven 133 are connected by valves 134-1, 134-2, . . . , and 134-N (collectively, valves 134) and mass flow controllers (MFCs) 136-1, 136-2, . . . , and 136-N (collectively, mass flow controllers (or MFCs) 136) to a mixing manifold 140. The process gases are supplied to the mixing manifold 140 and mixed therein. An output of the mixing manifold 140 is fed to the substrate processing chamber 102. In some examples, the output of the mixing manifold 140 is fed to the showerhead 109. Secondary purge gas 170 may be supplied to the processing chamber 102, such as behind the showerhead 109, via a valve 172 and an MFC 174. Although illustrated separately, the mixing manifold 140 may be part of the chemical delivery system 130.

Figure 4:
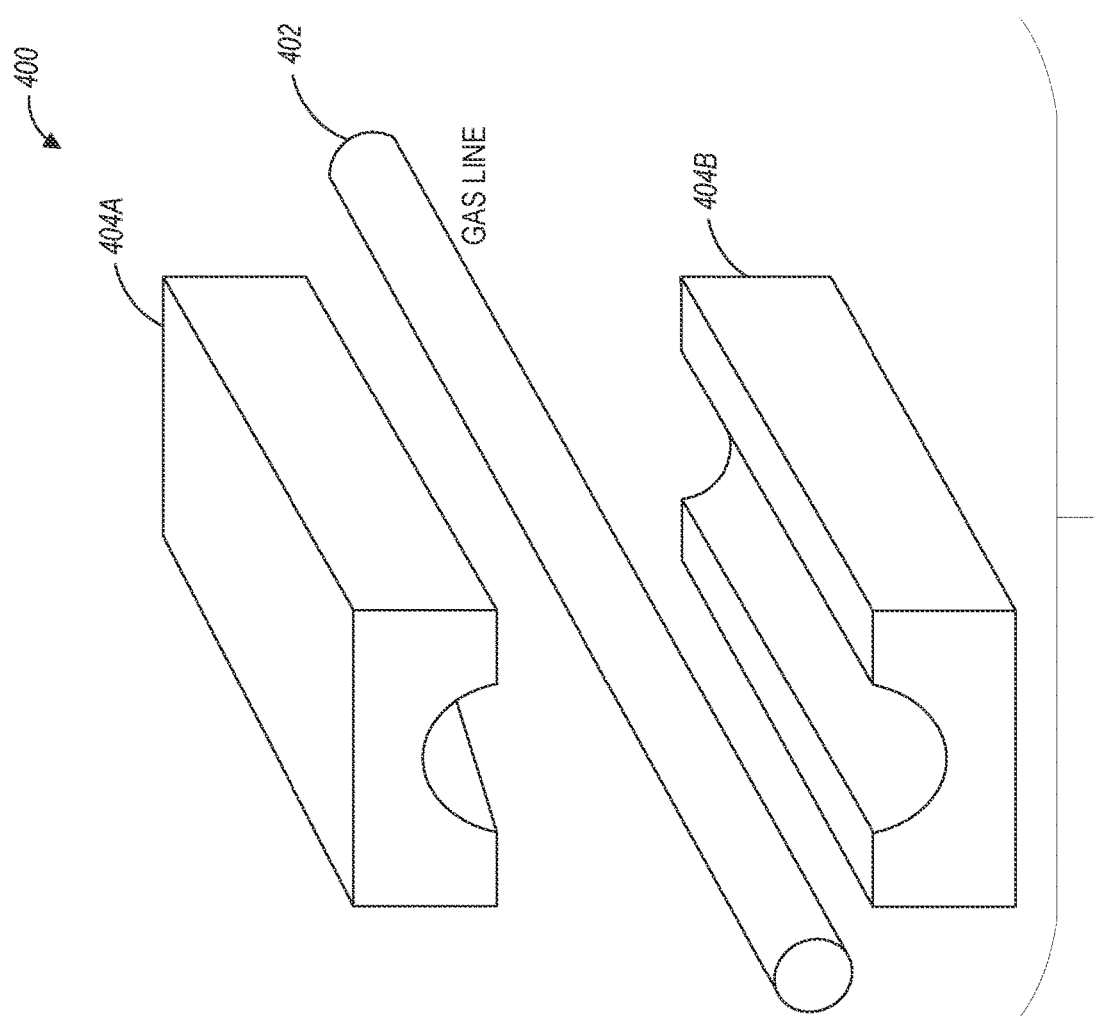
FIG. 4 illustrates a clamshell-type heating element for a gas line used in a chemical delivery module, according to some embodiments.
Figure 5:
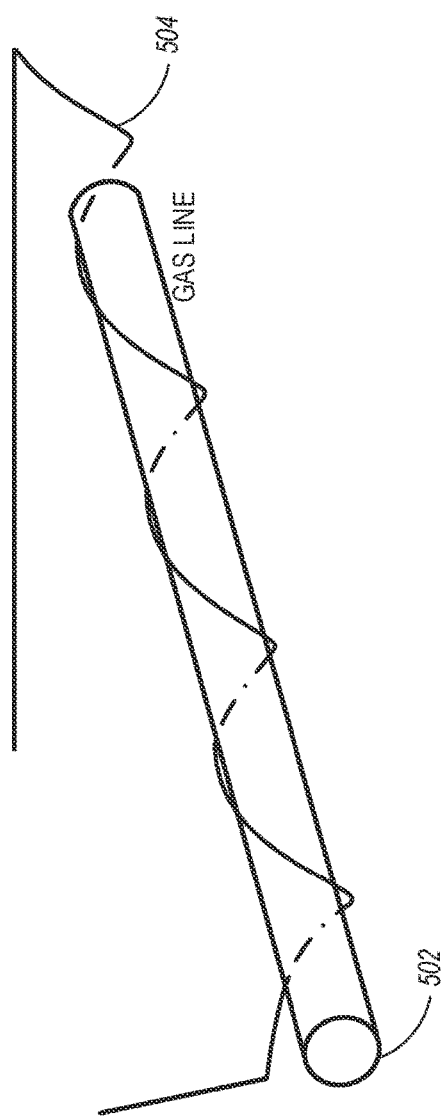
FIG. 5 illustrates a hand-wrapped heating element for a gas line used in a chemical delivery module, according to some embodiments.

In an example embodiment, gas lines between the process gas sources 132, the control oven 133, the valves 134, the MFCs 136, the mixing manifold 140, and the substrate processing chamber 102 may be configured with heating elements that are configured to heat one or more portions of the gas lines based on a predetermined temperature and as discussed herein. Example portions include insulated wall areas or other locations such as dead zones that the gas lines pass through which may cause the creation of cold spots. More specifically, the gas lines may include temperature sensors that determine the surface temperature of the one or more portions of the gas lines. A control module (e.g., system controller 160) detects the surface temperature measured by the temperature sensors and adjusts the heating temperature of the heating elements based on the predetermined temperature. In an example embodiment, the predetermined temperature is a sublimation temperature maintained in the process gas sources 132 to trigger the sublimation of solid precursors. In this regard, using the techniques discussed herein associated with the use of heating elements for heating the gas lines prevents clogging of the gas lines and increases the flow efficiency of the process gases. Different combinations of canister and control ovens within a chemical delivery module are illustrated in connection with FIG. 2 and FIG. 3. FIG. 4 and FIG. 5 illustrate different types of heating elements that can be used in connection with disclosed techniques.

A temperature controller 142 may be connected to a plurality of thermal control elements (TCEs) 144 arranged in the heating plate 112. For example, the TCEs 144 may include, but are not limited to, respective macro TCEs corresponding to each zone in a multi-zone heating plate and/or an array of micro TCEs disposed across multiple zones of a multi-zone heating plate. The temperature controller 142 may be used to control the plurality of TCEs 144 to control the temperature of the substrate support 106 and the substrate 108. The temperature controller 142 may communicate with a coolant assembly 146 to control coolant flow, through the channels 116. For example, the coolant assembly 146 may include a coolant pump and reservoir. The temperature controller 142 operates the coolant assembly 146 to selectively flow the coolant through the channels 116 to cool the substrate support 106. A valve 150 and pump 152 may be used to control pressure and to evacuate reactants from the processing chamber 102.

A system controller 160 may be used to control components of the substrate processing system 100, including dynamically monitoring and adjusting the surface temperature of the heating elements of gas lines within the chemical delivery system 130. Although shown as separate controllers, the temperature controller 142 may be implemented within the system controller 160.

Some examples of the present disclosure are directed to a chemical delivery system including one or more canister oven to generate process gas and a control oven that supplies the process gas to a chemical isolation chamber (such as chamber 102), where the gas lines used for delivering the process gas from the canister oven(s) to the control oven, and from the control oven to the chemical isolation chamber are configured with heating elements using the techniques discussed herein.

Figure 2:
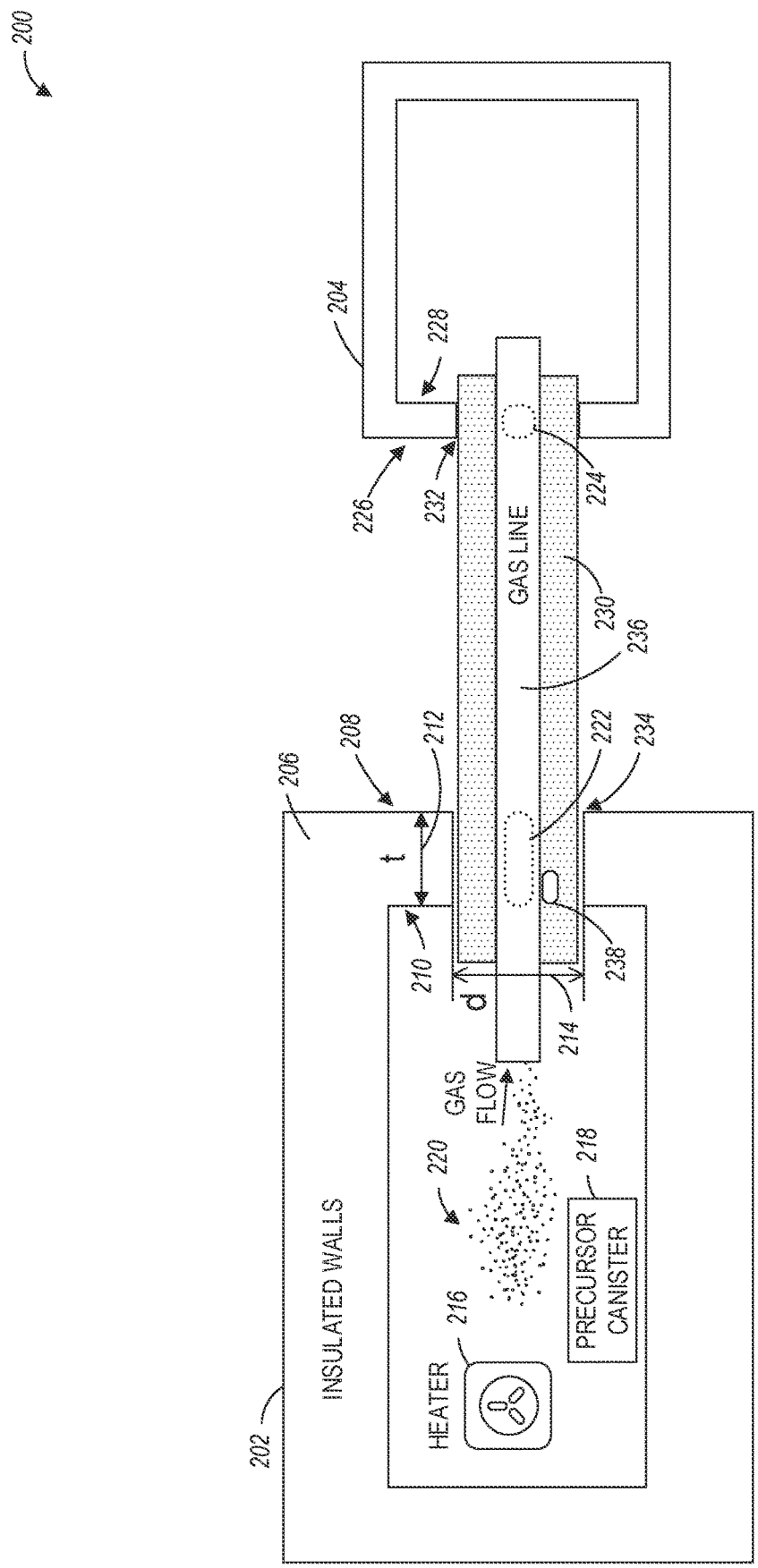
FIG. 2 illustrates a chemical delivery module including a single canister oven coupled to a chemical isolation chamber, according to some embodiments.

FIG. 2 illustrates a chemical delivery module 200 including a single canister oven coupled to a chemical isolation chamber, according to some embodiments. Referring to FG. 2, the chemical delivery module 200 includes a canister oven 202 configured to generate process gas (e.g., precursor gas) for delivery to a chemical isolation chamber 204 via a gas line 236.

The canister oven 202 is an enclosure formed by insulated walls 206, which is used to hold a precursor canister 218 with a solid or liquid precursor (or another type of chemical). The canister oven 202 further includes a heater 216 configured to heat the precursor canister 218 to generate a process gas 220. In some aspects, the heater 216 can include a fan and is configured to generate convection-type heat within the canister oven 202 to trigger sublimation of the precursor within the precursor canister 218 and generate the process gas 220. For example, heater 216 generates convection-type heat within the canister oven 202 up to a predetermined temperature (e.g., a sublimation temperature associated with the precursor within the precursor canister 218), resulting in the generation of the process gas 220.

The gas line 236 passes through an opening 234 in one of the insulated walls of the canister oven 202 as well as an opening 232 in an insulated wall of the chemical isolation chamber 204. More specifically, the gas line 236 extends between an inside surface 210 and an outside surface 208 of the canister oven 202 as it passes through the opening 234. Similarly, the gas line 236 extends between an inside surface 228 and an outside service 226 of the chemical isolation chamber 204 as it passes through the opening 232. As the gas line 236 passes through openings 234 and 232 in the insulated walls of the canister oven 202 and the chemical isolation chamber 204, cold spots 222 and 224 may form within the gas line 236 at locations proximate to the insulated walls. As used herein, the term "inside surface" of an oven or chamber refers to an interior of the oven or chamber, such as an interior wall. As used herein, the term "outside surface" refers to a surface, such as an outside wall, of the oven or chamber.

In an example embodiment, the chemical delivery module 200 further includes a heating element 230, which is attached to the gas line 236 and extends through the openings 232 and 234 to cover portions of the gas line that include the cold spots 222 and 224. More specifically, the heating element 230 extends between the inside surface 210 and the outside surface 208 of the canister oven 202 (to cover cold spot 222), as well as between the inside surface 228 and the outside surface 226 of the chemical isolation chamber 204 (to cover cold spot 224). The heating element 230 is configured to generate heat along the surface of the gas line 236 and prevent the formation of cold spots 222 and 224, which in turn prevents solidification of the precursor gas and clogging the gas line 236.

In an example embodiment, the heating element 230 can be installed and/or activated based on dimensions of the opening 234 of the canister oven 202. For example, opening 234 is characterized by a width (t) 212 of the insulated walls 206 and diameter (d) 214 of the opening 234. In aspects when the opening 234 is square or rectangular, dimension d can be the shortest distance of the opening. In some aspects, the heating element 230 can be installed and/or activated when $t/d \geq 0.05$.

In an example embodiment, the chemical delivery module 200 further includes one or more temperature sensors, such as temperature sensor 238, configured to measure the surface temperature of at least one portion of the gas line 236 (e.g., the portion of the gas line 236 between the inside surface 210 and the outside surface 208 of the canister oven 202. A controller module (e.g., the system controller 160 in FIG. 1) receives the measured surface temperature from the temperature sensor 238 and adjusts the heating temperature of the heating element 230 based on the predetermined temperature within the canister oven 202 (e.g., the sublimation temperature of the precursor within the precursor canister 218) and the measured surface temperature. For example, the system controller 160 receives the measured surface temperature and adjusts the heating temperature of the heating element 230 based on a difference between the predetermined temperature and the measured surface temperature.

In some aspects, such measurements of the surface temperature and adjustments of the heating temperature of the heating element 230 can be performed dynamically based on a predetermined schedule or can be triggered by an external command or other measurement triggers. Even though FIG. 2 illustrates a single temperature sensor 238 in proximity to a portion of the gas line 236 associated with the cold spot 222, the disclosure is not limited in this regard and multiple other sensors can be used along the gas line 236 to measure surface temperature in different zones of the gas line and adjust the heating temperature of the heating element 230 accordingly. In some aspects, the heating element 230 can include multiple heating zones, where the heating temperature of each heating zone can be controlled by the system controller 160 independently (e.g., based on the surface temperature measured for the particular heating zone). Example heating elements are illustrated in connection with FIG. 4 in FIG. 5.

Figure 3:
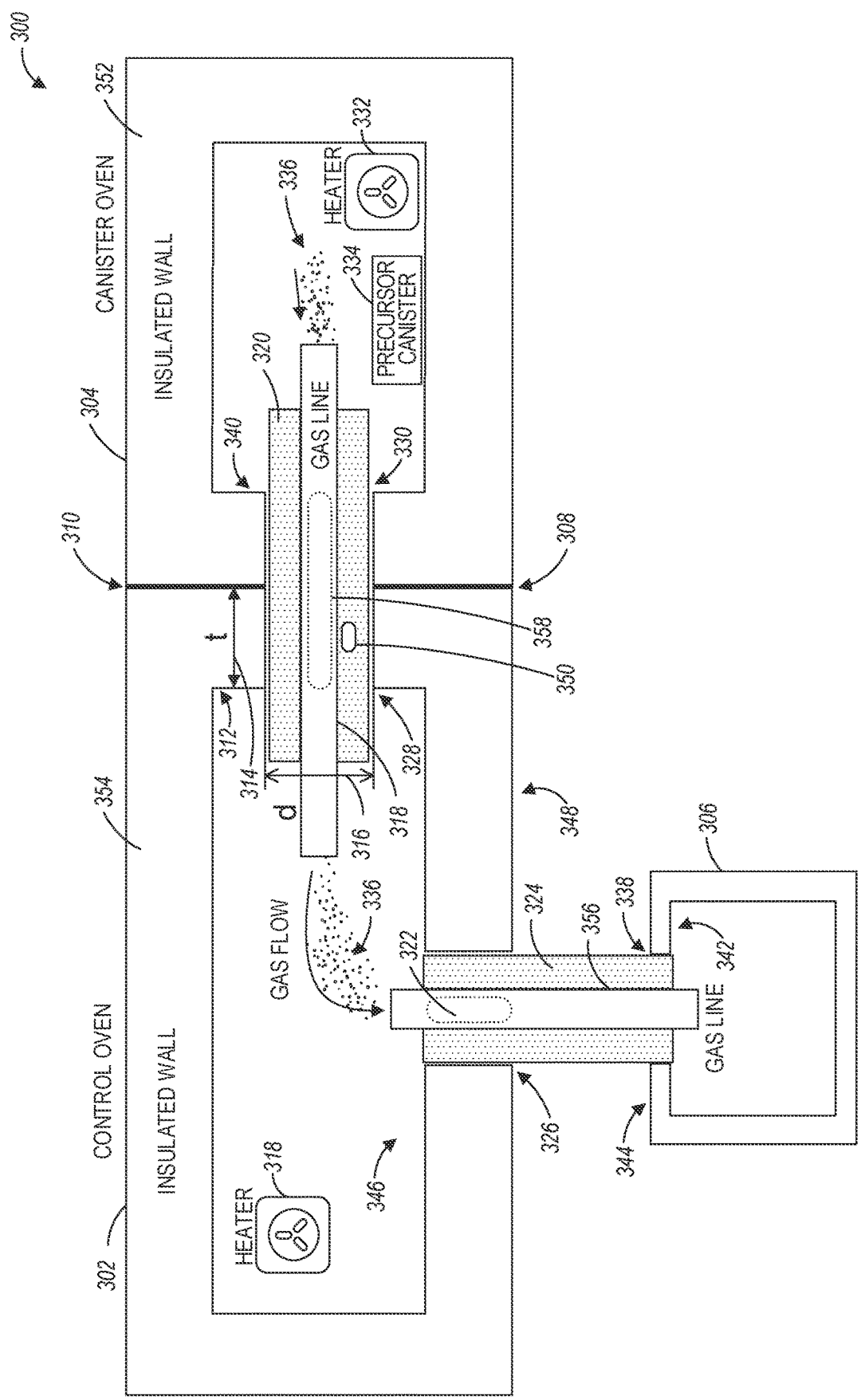
FIG. 3 illustrates a chemical delivery module including a canister oven and a control oven coupled to a chemical isolation chamber, according to some embodiments.

FIG. 3 illustrates a chemical delivery module 300 including a canister oven and a control oven coupled to a chemical isolation chamber, according to some embodiments. Referring to FIG. 3, the chemical delivery module 300 includes a canister oven 304 configured to generate process gas (e.g., precursor gas) for delivery to a control oven 302 via a gas line 318, and from the control oven 302 to a chemical isolation chamber 306 via a gas line 352.

The canister oven 304 is an enclosure formed by insulated walls 352, which is used to hold a precursor canister 334 with the solid or liquid precursor (or another type of chemical). The canister oven 304 further includes a heater 332 configured to heat the precursor canister 334 to generate a process gas 336. In some aspects, the heater 332 can include a fan and is configured to generate convection-type heat within the canister oven 304 to trigger sublimation of the precursor within the precursor canister 334 and generate the process gas 336. For example, heater 332 generates convection-type heat within the canister oven 304 up to a predetermined temperature (e.g. a sublimation temperature associated with the precursor within the precursor canister 334), resulting in the generation of the process gas 336.

The gas line 318 passes through an opening 330 in one of the insulated walls of the canister oven 304 as well as an opening 328 in one of the insulated walls 354 of the control oven 302. More specifically, the gas line 318 extends between an inside surface 340 and an outside surface 310 of the canister oven 304 as it passes through the opening 330. Similarly, the gas line 318 extends between an inside surface 312 and an outside service 308 of the control oven 302 as it passes through the opening 328. As the gas line 318 passes through openings 328 and 330 in the insulated walls of the control oven 302 and the canister oven 304, a cold spot 358 may form within the gas line 318 at locations proximate to the insulated walls 354 and 352 near openings 328 and 330.

The control oven 302 receives process gases from one or more canister ovens (e.g., process gas 336 from canister oven 304) and heats the process gas (or gases) using heater 318 (which can be a convection-type heater including a fan to circulate hot air within the oven). In an example embodiment, the control oven can be connected to a single canister oven (as illustrated in FIG. 3) or multiple canister ovens, with each oven supplying process gas to the control oven 302. The control oven 302 can be configured to perform additional processing of the received process gases as well as supply the process gases to the chemical isolation chamber 306.

The gas line 356 passes through an opening 326 in one of the insulated walls 354 of the control oven 302 as well as an opening 338 in one of the insulated walls of the chemical isolation chamber 306. More specifically, the gas line 318 extends between an inside surface 346 and an outside surface 348 of the control oven 302 as it passes through the opening 326. Similarly, the gas line 356 extends between an inside surface 342 and an outside service 344 of the chemical isolation chamber 306 as it passes through the opening 338. As the gas line 356 passes through openings 326 and 338 in the insulated walls of the control oven 302 and the chemical isolation chamber 306, a cold spot 322 may form within the gas line 356 at locations proximate to the insulated walls near openings 326 and 338.

In an example embodiment, the chemical delivery module 300 further includes a heating element 320, which is attached to the gas line 318 and extends through the openings 328 and 330 to cover portions of the gas line that include the cold spot 358. More specifically, the heating element 320 extends between the inside surface 340 and the outside surface 310 of the canister oven 304 as well as between the inside surface 312 and the outside surface 308 of the control oven 302 (to cover cold spot 358). The heating element 320 is configured to generate heat along the surface of the gas line 318 and prevent the formation of the cold spot 358, which in turn prevents solidification of the precursor gas and clogging the gas line 318.

In an example embodiment, the chemical delivery module 300 further includes a heating element 324, which is attached to the gas line 356 and extends through the openings 326 and 338 to cover portions of the gas line that include the cold spot 322. More specifically, the heating element 324 extends between the inside surface 342 and the outside surface 344 of the chemical isolation chamber 306 as well as between the inside surface 346 and the outside surface 348 of the control oven 302 (to cover cold spot 322). The heating element 324 is configured to generate heat along the surface of the gas line 356 and prevent the formation of the cold spot 322, which in turn prevents solidification of the precursor gas and clogging the gas line 356.

In an example embodiment, heating elements 320 and 324 can be installed and/or activated based on dimensions of the openings 328, 330, 326, and 338. For example, opening 328 is characterized by a width (t) 314 of the insulated walls 354 and diameter (d) 316 of the opening 328. In aspects when the opening 328 is square or rectangular, dimension d can be the shortest distance of the opening. In some aspects, the heating element 320 can be installed and/or activated when $t/d \geq 0.05$.

In an example embodiment, the chemical delivery module 300 further includes one or more temperature sensors, such as temperature sensor 350, configured to measure the surface temperature of at least one portion of the gas line 318 (e.g., the portion of the gas line 318 between the inside surface 312 and the outside surface 308 of the control oven 302. A controller module (e.g., the system controller 160 in FIG. 1) receives the measured surface temperature from the temperature sensor 350 and adjusts the heating temperature of the heating element 320 based on the predetermined temperature within the canister oven 304 (e.g., the sublimation temperature of the precursor within the precursor canister 334) and the measured surface temperature. For example, the system controller 160 receives the measured surface temperature and adjusts the heating temperature of the heating element 320 based on a difference between the predetermined temperature and the measured surface temperature.

In some aspects, such measurements of the surface temperature and adjustments of the heating temperature of the heating element 320 can be performed dynamically based on a predetermined schedule or can be triggered by an external command or other measurement triggers. Even though FIG. 3 illustrates a single temperature sensor 350 in proximity to a portion of the gas line 318 associated with the cold spot 358, the disclosure is not limited in this regard and multiple other sensors can be used along multiple gas lines of the chemical delivery module 300 to measure surface temperature in different zones of the gas lines and adjust the heating temperature of corresponding heating elements accordingly. For example, the heating element 320 can include multiple heating zones, where the heating temperature of each heating zone can be controlled by the system controller 160 independently (e.g., based on the surface temperature measured for the particular heating zone). Example heating elements are illustrated in connection with FIG. 4 in FIG. 5.

FIG. 4 illustrates a clamshell-type heating element 400 for a gas line 402 used in a chemical delivery module, according to some embodiments. Referring to FIG. 4, heating element 400 is illustrated in a disassembled state and it may include clamshells 404A and 404B which can be secured around the gas line 402. Clamshells 404A and 404B can include clamshells with one or more fire-rod heaters, clamshells with one or more hand-wrapped heaters, and clamshells with one or more bonded heaters. Other types of heating elements may be used with the clamshells 404A and 404B as well. FIG. 2 and FIG. 3 illustrates a side view of heating elements such as clamshell-type heating elements that surround a gas line when the clamshells are attached and enclose the gas line.

FIG. 5 illustrates a hand-wrapped heating element 504 for a gas line 502 used in a chemical delivery module, according to some embodiments. In some aspects, heating element 504 can include a bonded heater or another type of heating element which can be attached to the gas line 502 via adhesive, mounting brackets, clamshells, or other types of attachment means.

Figure 6:
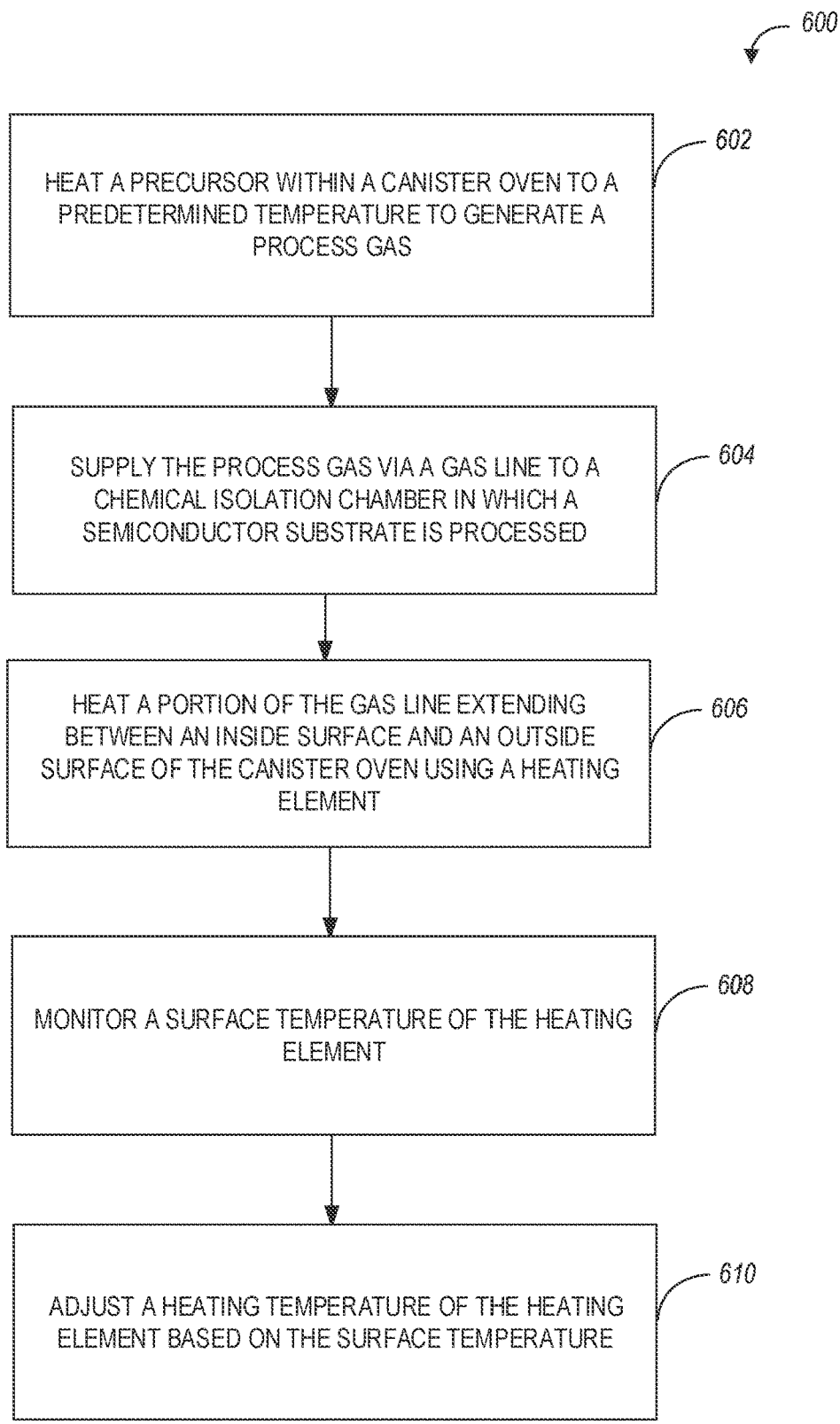
FIG. 6 is a flowchart of a method for processing a semiconductor substrate using a chemical delivery module with one or more gas line heating modules, according to some example embodiments.

FIG. 6 is a flowchart of a method 600 for processing a semiconductor substrate using a chemical delivery module with one or more gas line heating modules, according to some example embodiments. Method 600 includes operations 602, 604, 606, 608, and 610, which may be performed by control logic (or the control logic configures or causes other modules to perform the function), such as the system controller 160 of FIG. 1 that manages the operation of the substrate processing apparatus 100. Referring to FIG. 6, at operation 602, a precursor is heated within a canister oven to a predetermined temperature to generate a process gas. For example and about FIG. 2, precursor within the precursor canister 218 and canister oven 202 is heated by heater 216 to generate process gas 220. At operation 604, the process gas is supplied via a gas line to a chemical isolation chamber in which a semiconductor substrate is processed. For example, process gas 220 is supplied via gas line 236 to the chemical isolation chamber 204. The gas line 236 extends between the canister oven 202 and the chemical isolation chamber 204.

At operation 606, a portion of the gas line extending between an inside surface and an outside surface of the canister oven is heated using a heating element. For example, a portion of the gas line 236 extending between the inside surface 210 and the outside surface 208 of the canister oven 202 is heated using heating element 230. At operation 608, the surface temperature of the heating element is monitored. For example, the surface temperature of the heating element 230 is monitored by the system controller 160 using the temperature sensor 238. At operation 610, the heating temperature of the heating element is adjusted based on the surface temperature. For example, the heating temperature of the heating element 230 is adjusted by the system controller 160 based on the surface temperature received from the temperature sensor 238.

Figure 7:
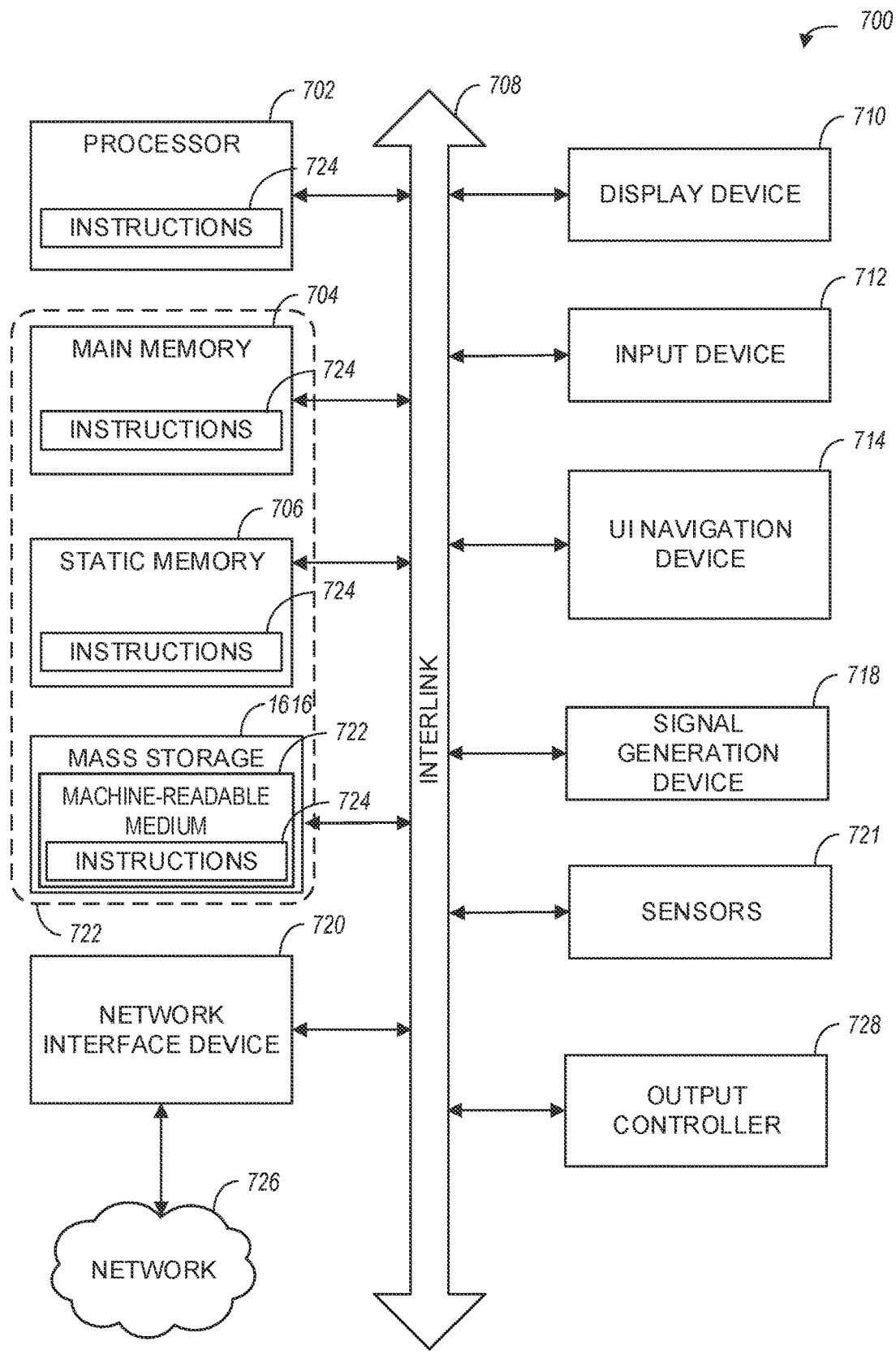
FIG. 7 is a block diagram illustrating an example of a machine upon which one or more example method embodiments may be implemented, or by which one or more example embodiments may be controlled.

FIG. 7 is a block diagram illustrating an example of a machine 700 upon which one or more example method embodiments may be implemented, or by which one or more example embodiments may be controlled. In alternative embodiments, the machine 700 may operate as a standalone device or may be connected (e.g., networked) to other machines. In a networked deployment, the machine 700 may operate in the capacity of a server machine, a client machine, or both in server-client network environments. In an example, the machine 700 may act as a peer machine in a peer-to-peer (P2P) (or other distributed) network environment. Further, while only a single machine 700 is illustrated, the term "machine" shall also be taken to include any collection of machines that individually or jointly execute a set (or multiple sets) of instructions to perform any one or more of the methodologies discussed herein, such as via cloud computing, software as a service (SaaS), or other computer cluster configurations.

Examples, as described herein, may include, or may operate by, logic, several components, or mechanisms. Circuitry is a collection of circuits implemented in tangible entities that include hardware (e.g., simple circuits, gates, logic). Circuitry membership may be flexible over time and underlying hardware variability. Circuitries include members that may, alone or in combination, perform specified operations when operating. In an example, the hardware of the circuitry may be immutably designed to carry out a specific operation (e.g., hardwired). In an example, the hardware of the circuitry may include variably connected physical components (e.g., execution units, transistors, simple circuits) including a computer-readable medium physically modified (e.g., magnetically, electrically, by the moveable placement of invariant massed particles) to encode instructions of the specific operation. In connecting the physical components, the underlying electrical properties of a hardware constituent are changed (for example, from an insulator to a conductor or vice versa). The instructions enable embedded hardware (e.g., the execution units or a loading mechanism) to create members of the circuitry in hardware via the variable connections to carry out portions of the specific operation when in operation. Accordingly, the computer-readable medium is communicatively coupled to the other components of the circuitry when the device is operating. In some aspects, any of the physical components may be used in more than one member of more than one circuitry. For example, under operation, execution units may be used in a first circuit of a first circuitry at one point in time and reused by a second circuit in the first circuitry, or by a third circuit in a second circuitry, at a different time.

The machine (e.g., computer system) 700 may include a hardware processor 702 (e.g., a central processing unit (CPU), a hardware processor core, a graphics processing unit (GPU), or any combination thereof), a main memory 704, and a static memory 706, some or all of which may communicate with each other via an interlink (e.g., bus) 708. The machine 700 may further include a display device 710, an alphanumeric input device 712 (e.g., a keyboard), and a user interface (UT) navigation device 714 (e.g., a mouse). In an example, the display device 710, alphanumeric input device 712, and UI navigation device 714 may be a touch screen display. The machine 700 may additionally include a mass storage device (e.g., drive unit) 716, a signal generation device 718 (e.g., a speaker), a network interface device 720, and one or more sensors 721, such as a Global Positioning System (GPS) sensor, compass, accelerometer, or another sensor. The machine 700 may include an output controller 728, such as a serial (e.g., universal serial bus (USB)), parallel, or other wired or wireless (e.g., infrared (TR), near field communication (NFC)) connection to communicate with or control one or more peripheral devices (e.g., a printer, card reader).

In an example embodiment, the hardware processor 702 may, perform the functionalities of the system controller 160 or any control logic discussed hereinabove to configure and control functionalities described herein (e.g., as discussed in connection with at least FIG. 1-FIG. 6).

The mass storage device 716 may include a machine-readable medium 722 on which is stored one or more sets of data structures or instructions 724 (e.g., software) embodying or utilized by any one or more of the techniques or functions described herein. The instructions 724 may also reside, completely or at least partially, within the main memory 704, within the static memory 706, or within the hardware processor 702 during execution thereof by the machine 700. In an example, one or any combination of the hardware processor 702, the main memory 704, the static memory 706, or the mass storage device 716 may constitute machine-readable media.

While the machine-readable medium 722 is illustrated as a single medium, the term "machine-readable medium" may include a single medium or multiple media, (e.g., a centralized or distributed database, and/or associated caches and servers) configured to store the one or more instructions 724.

The term "machine-readable medium" may include any medium that is capable of storing, encoding, or carrying instructions 724 for execution by the machine 700 and that cause the machine 700 to perform any one or more of the techniques of the present disclosure, or that is capable of storing, encoding, or carrying data structures used by or associated with such instructions 724. Non-limiting machine-readable medium examples may include solid-state memories and optical and magnetic media. In an example, a massed machine-readable medium comprises a machine-readable medium 722 with a plurality of particles having invariant (e.g., rest) mass. Accordingly, massed machine-readable media are not transitory propagating signals. Specific examples of massed machine-readable media may include non-volatile memory, such as semiconductor memory devices (e.g., Electrically Programmable Read-Only Memory (EPROM), Electrically Erasable Programable Read-Only Memory (EEPROM)) and flash memory devices; magnetic disks, such as internal hard disks and removable disks; magneto-optical disks; and CD-ROM and DVD-ROM disks.

The instructions 724 may further be transmitted or received over a communications network 726 using a transmission medium via the network interface device 720.

Implementation of the preceding techniques may be accomplished through any number of specifications, configurations, or example deployments of hardware and software. It should be understood that the functional units or capabilities described in this specification may have been referred to or labeled as components or modules, to more particularly emphasize their implementation independence. Such components may be embodied by any number of software or hardware forms. For example, a component or module may be implemented as a hardware circuit comprising custom very-large-scale integration (VLSI) circuits or gate arrays, off-the-shelf semiconductors such as logic chips, transistors, or other discrete components. A component or module may also be implemented in programmable hardware devices such as field-programmable gate arrays, programmable array logic, programmable logic devices, or the like. Components or modules may also be implemented in software for execution by various types of processors. An identified component or module of executable code may, for instance, comprise one or more physical or logical blocks of computer instructions, which may, for instance, be organized as an object, procedure, or function. Nevertheless, the executables of an identified component or module need not be physically located together but may comprise disparate instructions stored in different locations which, when joined logically together, comprise the component or module and achieve the stated purpose for the component or module.

Indeed, a component or module of executable code may be a single instruction, or many instructions, and may even be distributed over several different code segments, among different programs, and across several memory devices or processing systems. In particular, some aspects of the described process (such as code rewriting and code analysis) may take place on a different processing system (e.g., in a computer in a data center), than that in which the code is deployed (e.g., in a computer embedded in a sensor or robot). Similarly, operational data may be identified and illustrated herein within components or modules and may be embodied in any suitable form and organized within any suitable type of data structure. The operational data may be collected as a single data set or may be distributed over different locations including over different storage devices, and may exist, at least partially, merely as electronic signals on a system or network. The components or modules may be passive or active, including agents operable to perform desired functions.

ADDITIONAL NOTES & EXAMPLES

Example 1 is a semiconductor substrate processing apparatus, the apparatus includes a chemical isolation chamber for processing a semiconductor substrate; a chemical delivery module in fluid communication with the chemical isolation chamber, the chemical delivery module comprising: a canister oven configured to heat a precursor to a predetermined temperature and generate a process gas using the heated precursor; a control oven configured to receive the process gas via a first gas line and supply the process gas to the chemical isolation chamber via a second gas line for processing the semiconductor substrate, the first gas line extending between an inside surface of the canister oven and an inside surface of the control oven; and a heating element configured to heat a portion of the first gas line between the inside surface of the canister oven and the inside surface of the control oven; and a controller module coupled to the chemical delivery module and the chemical isolation chamber, the controller module configured to detect a temperature of the portion of the first gas line and adjust a heating temperature of the heating element based on the detected temperature.

In Example 2, the subject matter of Example 1 includes subject matter where the predetermined temperature is a sublimation temperature of the precursor, and the control module is configured to adjust the heating temperature of the heating element to the sublimation temperature.

In Example 3, the subject matter of Examples 1-2 includes subject matter where the chemical delivery module comprises: a second canister oven configured to heat a second precursor to a second predetermined temperature and generate a second process gas using the heated second precursor; wherein the control oven is configured to receive the second process gas via a third gas line and supply the second process gas to the chemical isolation chamber via the second gas line for processing the semiconductor substrate, the third gas line extending between an inside surface of the second canister oven and the inside surface of the control oven.

In Example 4, the subject matter of Example 3 includes subject matter where the chemical delivery module comprises: a second heating element configured to heat a portion of the third gas line between the inside surface of the second canister oven and the inside surface of the control oven.

In Example 5, the subject matter of Example 4 includes subject matter where the chemical delivery module comprises: a third heating element configured to heat a portion of the second gas line between the inside surface of the control oven and an outside surface of the control oven.

In Example 6, the subject matter of Example 5 includes subject matter where the chemical delivery module comprises a plurality of temperature sensors configured to measure surface temperatures of the portion of the first gas line, the portion of the second gas line, and the portion of the third gas line.

In Example 7, the subject matter of Example 6 includes subject matter where the controller module is configured to adjust the heating temperature of the heating element, a heating temperature of the second heating element, and a heating temperature of the third heating element based on a difference between the predetermined temperature and at least one of the measured surface temperatures.

In Example 8, the subject matter of Examples 1-7 includes subject matter where the heating element comprises one of the clamshells with a fire-rod heater; clamshells with a hand-wrapped heater; clamshells with a bonded heater; a gas line-mounted hand-wrapped heater; and a gas line-mounted bonded heater.

Example 9 is a chemical delivery module for supplying process gas to a chemical isolation chamber of a semiconductor substrate processing apparatus, the chemical delivery module comprising: a canister oven configured to heat a precursor to a predetermined temperature and generate the process gas using the heated precursor; a control oven configured to receive the process gas via a first gas line and supply the process gas to the chemical isolation chamber via a second gas line for processing the semiconductor substrate, the first gas line extending between an inside surface of the canister oven and an inside surface of the control oven; a heating element configured to heat a portion of the first gas line between the inside surface of the canister oven and the inside surface of the control oven, and a controller module configured to detect a temperature of the portion of the first gas line and adjust a heating temperature of the heating element based on the detected temperature.

In Example 10, the subject matter of Example 9 includes subject matter where the predetermined temperature is a sublimation temperature of the precursor.

In Example 11, the subject matter of Example 10 includes subject matter where the control oven comprises a second heating element, and wherein the control module is configured to adjust the heating temperature of the heating element and a heating temperature of the second heating element to the sublimation temperature.

In Example 12, the subject matter of Examples 9-11 includes subject matter where the second gas line extends between the inside surface of the control oven and an outside surface of the control oven, and wherein the chemical delivery module comprises a second heating element configured to heat a portion of the second gas line between the inside surface and the outside surface of the control oven.

In Example 13, the subject matter of Example 12 includes subject matter where the chemical delivery module comprises a plurality of temperature sensors configured to periodically measure surface temperatures of the portion of the first gas line and the portion of the second gas line.

In Example 14, the subject matter of Example 13 includes subject matter where the controller module is configured to adjust the heating temperature of the heating element and a heating temperature of the second heating element based on a difference between the predetermined temperature and at least one of the measured surface temperatures.

In Example 15, the subject matter of Examples 1-14 includes subject matter where the heating element comprises one of the following: clamshells with a fire-rod heater; clamshells with a hand-wrapped heater; clamshells with a bonded heater; a gas line-mounted hand-wrapped heater; and a gas line-mounted bonded heater.

Example 16 is a method for processing a semiconductor substrate, the method comprising: heating a precursor within a canister oven to a predetermined temperature to generate a process gas; supplying the process gas via a gas line to a chemical isolation chamber in which the semiconductor substrate is processed, the gas line extending between the canister oven and the chemical isolation chamber; heating a portion of the gas line extending between an inside surface and an outside surface of the canister oven using a heating element; monitoring a surface temperature of the heating element, and adjusting a heating temperature of the heating element based on the surface temperature.

In Example 17, the subject matter of Example 16 includes, determining a deviation of the surface temperature from the predetermined temperature; and adjusting the heating temperature based on the deviation.

In Example 18, the subject matter of Examples 16-17 includes, heating a second portion of the gas line extending between an inside surface and an outside surface of the chemical isolation chamber using a second heating element.

In Example 19, the subject matter of Example 18 includes, monitoring a second surface temperature, the second surface temperature associated with the second heating element; and adjusting a heating temperature of the second heating element based on the second surface temperature.

In Example 20, the subject matter of Example 19 includes subject matter where the heating element and the second heating element comprise one of the following: clamshells with a fire-rod heater; clamshells with a hand-wrapped heater; clamshells with a bonded heater; a gas line-mounted hand-wrapped heater; and a gas line-mounted bonded heater.

Example 21 is at least one machine-readable medium including instructions that, when executed by processing circuitry, cause the processing circuitry to perform operations to implement any of Examples 1-20.

Example 22 is an apparatus comprising means to implement any of Examples 1-20.

Example 23 is a system to implement any of Examples 1-20.

Example 24 is a method to implement any of Examples 1-20.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components for example configurations may be implemented as a combined structure or component. Similarly, structures and functionality presented as a single component may be implemented as separate components. These and other variations, modifications, additions, and improvements fall within the scope of the subject matter herein.

The embodiments illustrated herein are described in sufficient detail to enable those skilled in the art to practice the teachings disclosed. Other embodiments may be used and derived therefrom, such that structural and logical substitutions and changes may be made without departing from the scope of this disclosure. The Detailed Description, therefore, is not to be taken in a limiting sense, and the scope of various embodiments is defined only by the appended claims, along with the fill range of equivalents to which such claims are entitled.

The claims may not set forth every feature disclosed herein as embodiments may feature a subset of said features. Further, embodiments may include fewer features than those disclosed in a particular example. Thus, the following claims are hereby incorporated into the Detailed Description, with a claim standing on its own as a separate embodiment.

As used herein, the term "or" may be construed in either an inclusive or exclusive sense. Moreover, plural instances may be provided for resources, operations, or structures described herein as a single instance. Additionally, boundaries between various resources, operations, modules, engines, and data stores are somewhat arbitrary, and particular operations are illustrated in a context of specific illustrative configurations. Other allocations of functionality are envisioned and may fall within the scope of various embodiments of the present disclosure. In general, structures and functionality presented as separate resources in the example configurations may be implemented as a combined structure or resource. Similarly, structures and functionality presented as a single resource may be implemented as separate resources. These and other variations, modifications, additions, and improvements fall within a scope of embodiments of the present disclosure as represented by the appended claims. The specification and drawings are, accordingly, to be regarded in an illustrative rather than a restrictive sense.

What is claimed is:

1. A semiconductor substrate processing apparatus, the apparatus comprising:
    a chemical isolation chamber for processing a semiconductor substrate;
    a chemical delivery module in fluid communication with the chemical isolation chamber, the chemical delivery module comprising:
        a canister oven configured to heat a precursor to a predetermined temperature and generate a process gas using the heated precursor;
        a control oven configured to receive the process gas via a first gas line and supply the process gas to the chemical isolation chamber via a second gas line for processing the semiconductor substrate, the first gas line extending between an inside surface of the canister oven and an inside surface of the control oven; and
        a heating element configured to heat a portion of the first gas line between the inside surface of the canister oven and the inside surface of the control oven; and
    a controller module coupled to the chemical delivery module and the chemical isolation chamber, the controller module configured to detect a temperature of the portion of the first gas line and adjust a heating temperature of the heating element based on the detected temperature.

2. The apparatus of claim 1, wherein the predetermined temperature is a sublimation temperature of the precursor, and the controller module is configured to adjust the heating temperature of the heating element to the sublimation temperature.

3. The apparatus of claim 1, wherein the chemical delivery module comprises:
    a second canister oven configured to heat a second precursor to a second predetermined temperature and generate a second process gas using the heated second precursor;
    wherein the control oven is configured to receive the second process gas via a third gas line and supply the second process gas to the chemical isolation chamber via the second gas line for processing the semiconductor substrate, the third gas line extending between an inside surface of the second canister oven and the inside surface of the control oven.

4. The apparatus of claim 3, wherein the chemical delivery module comprises:
    a second heating element configured to heat a portion of the third gas line between the inside surface of the second canister oven and the inside surface of the control oven.

5. The apparatus of claim 4, wherein the chemical delivery module comprises:
    a third heating element configured to heat a portion of the second gas line between the inside surface of the control oven and an outside surface of the control oven.

6. The apparatus of claim 5, wherein the chemical delivery module comprises a plurality of temperature sensors configured to measure surface temperatures of the portion of the first gas line, the portion of the second gas line, and the portion of the third gas line.

7. The apparatus of claim 6, wherein the controller module is configured to adjust the heating temperature of the heating element, a heating temperature of the second heating element, and a heating temperature of the third heating element based on a difference between the predetermined temperature and at least one of the measured surface temperatures.

8. The apparatus of claim 1, wherein the heating element comprises one of:
    clamshells with a fire-rod heater;

clamshells with a hand-wrapped heater;
clamshells with a bonded heater;
a gas line-mounted hand-wrapped heater; and
a gas line-mounted bonded heater.

9. A chemical delivery module for supplying process gas to a chemical isolation chamber of a semiconductor substrate processing apparatus, the chemical delivery module comprising:
 a canister oven configured to heat a precursor to a predetermined temperature and generate the process gas using the heated precursor;
 a control oven configured to receive the process gas via a first gas line and supply the process gas to the chemical isolation chamber via a second gas line for processing the semiconductor substrate, the first gas line extending between an inside surface of the canister oven and an inside surface of the control oven;
 a heating element configured to heat a portion of the first gas line between the inside surface of the canister oven and the inside surface of the control oven; and
 a controller module configured to detect a temperature of the portion of the first gas line and adjust a heating temperature of the heating element based on the detected temperature.

10. The apparatus of claim 9, wherein the predetermined temperature is a sublimation temperature of the precursor.

11. The apparatus of claim 10, wherein the control oven comprises a second heating element, and wherein the controller module is configured to adjust the heating temperature of the heating element and a heating temperature of the second heating element to the sublimation temperature.

12. The apparatus of claim 9, wherein the second gas line extends between the inside surface of the control oven and an outside surface of the control oven, and wherein the chemical delivery module comprises a second heating element configured to heat a portion of the second gas line between the inside surface and the outside surface of the control oven.

13. The apparatus of claim 12, wherein the chemical delivery module comprises a plurality of temperature sensors configured to periodically measure surface temperatures of the portion of the first gas line and the portion of the second gas line.

14. The apparatus of claim 13, wherein the controller module is configured to adjust the heating temperature of the heating element and a heating temperature of the second heating element based on a difference between the predetermined temperature and at least one of the measured surface temperatures.

15. The apparatus of claim 9, wherein the heating element comprises one of: clamshells with a fire-rod heater clamshells with a hand-wrapped heater; clamshells with a bonded heater; a gas line-mounted hand-wrapped heater; and a gas line-mounted bonded heater.

16. A method for processing a semiconductor substrate, the method comprising:
 heating a precursor within a canister oven to a predetermined temperature to generate a process gas;
 supplying the process gas via a gas line to a chemical isolation chamber in which the semiconductor substrate is processed, the gas line extending between the canister oven and the chemical isolation chamber;
 heating a portion of the gas line extending between an inside surface and an outside surface of the canister oven using a heating element;
 monitoring a surface temperature of the heating element; and
 adjusting a heating temperature of the heating element based on the surface temperature.

17. The method of claim 16, further comprising:
 determining a deviation of the surface temperature from the predetermined temperature; and
 adjusting the heating temperature based on the deviation.

18. The method of claim 16, further comprising:
 heating a second portion of the gas line extending between an inside surface and an outside surface of the chemical isolation chamber using a second heating element.

19. The method of claim 18, further comprising:
 monitoring a second surface temperature, the second surface temperature associated with the second heating element; and
 adjusting a heating temperature of the second heating element based on the second surface temperature.

20. The method of claim 19, wherein the heating element and the second heating element comprise one of:
 clamshells with a fire-rod heater;
 clamshells with a hand-wrapped heater;
 clamshells with a bonded heater;
 a gas line-mounted hand-wrapped heater; and
 a gas line-mounted bonded heater.

* * * * *